(12) United States Patent
Zhang et al.

(10) Patent No.: US 7,498,656 B2
(45) Date of Patent: Mar. 3, 2009

(54) ELECTROMAGNETIC SHIELDING STRUCTURE

(75) Inventors: Ligang Zhang, Austin, TX (US); David Pietruszynski, Austin, TX (US); Axel Thomsen, Austin, TX (US); Kevin G. Smith, Austin, TX (US)

(73) Assignee: Silicon Laboratories Inc., Austin, TX (US)

( * ) Notice: Subject to any disclaimer, the term of this patent is extended or adjusted under 35 U.S.C. 154(b) by 418 days.

(21) Appl. No.: 10/813,886

(22) Filed: Mar. 31, 2004

(65) Prior Publication Data

US 2004/0178472 A1  Sep. 16, 2004

(51) Int. Cl.
*H01F 27/28* (2006.01)

(52) U.S. Cl. ............... 257/531; 257/528; 257/277; 257/686; 257/422; 257/685; 257/777; 257/778; 257/E23.114; 257/E23.125; 257/E21.022

(58) Field of Classification Search ......... 257/531, 257/528, 277, E23.114, E23.125, E21.022, 257/686, 422, 685, 777, 778
See application file for complete search history.

(56) References Cited

U.S. PATENT DOCUMENTS

| | | | |
|---|---|---|---|
| 5,083,236 A | 1/1992 | Chason et al. | |
| 5,446,311 A | 8/1995 | Ewen et al. | |
| 5,459,368 A | 10/1995 | Onishi et al. | |
| 5,461,353 A | 10/1995 | Eberhardt | |
| 5,559,360 A | 9/1996 | Chiu et al. | |
| 5,760,456 A | 6/1998 | Grzegorek et al. | |
| 5,793,272 A | 8/1998 | Burghartz et al. | |
| 5,884,990 A | 3/1999 | Burghartz et al. | |
| 5,918,121 A | 6/1999 | Wen et al. | |
| 5,959,515 A | 9/1999 | Cornett et al. | |
| 5,959,522 A * | 9/1999 | Andrews | 336/200 |
| 6,008,102 A | 12/1999 | Alford et al. | |
| 6,037,649 A * | 3/2000 | Liou | 257/531 |
| 6,046,109 A | 4/2000 | Liao et al. | |
| 6,054,329 A | 4/2000 | Burghartz et al. | |
| 6,114,937 A | 9/2000 | Burghartz et al. | |

(Continued)

FOREIGN PATENT DOCUMENTS

EP  0 675 539 A2  10/1995

(Continued)

OTHER PUBLICATIONS

"Unitive—CSP On the Edge", Unitive Inc. 2003 (from website—http://www.unitive.com/cspedge/index.cfm), 2 pages.

(Continued)

*Primary Examiner*—Lynne Gurley
*Assistant Examiner*—Junghwa Im
(74) *Attorney, Agent, or Firm*—Zagorin O'Brien Graham LLP

(57) ABSTRACT

An improved electromagnetic shielding structure has been discovered. In one embodiment of the invention, an apparatus includes an inductor and an electrically conductive enclosure that electromagnetically shields the inductor. The electrically conductive enclosure has an aperture at least as large as the inductor. The aperture is substantially centered around a projected surface of the inductor. The apparatus may include one or more electrically conductive links extending across the aperture and electrically coupled to the electrically conductive enclosure. The electrically conductive links reduce an effect of electromagnetic signals external to the electrically conductive enclosure on the inductor.

22 Claims, 16 Drawing Sheets

U.S. PATENT DOCUMENTS

| | | | |
|---|---|---|---|
| 6,124,624 | A | 9/2000 | Van Roosmalen et al. |
| 6,146,958 | A | 11/2000 | Zhao et al. |
| 6,153,489 | A | 11/2000 | Park et al. |
| 6,169,008 | B1 | 1/2001 | Wen et al. |
| 6,218,729 | B1 | 4/2001 | Zavrel, Jr. et al. |
| 6,362,525 | B1 | 3/2002 | Rahim |
| 6,389,691 | B1 | 5/2002 | Rinne et al. |
| 6,486,534 | B1 | 11/2002 | Sridharan et al. |
| 6,501,169 | B1 | 12/2002 | Aoki et al. |
| 6,534,843 | B2 | 3/2003 | Acosta et al. |
| 6,600,208 | B2 * | 7/2003 | Brennan et al. ............. 257/531 |
| 6,653,557 | B2 * | 11/2003 | Wolf et al. ................ 174/35 R |
| 6,847,282 | B2 * | 1/2005 | Gomez et al. ............... 336/200 |
| 6,873,065 | B2 | 3/2005 | Haigh et al. |
| 6,900,087 | B2 | 5/2005 | Lowther et al. |
| 6,900,538 | B2 | 5/2005 | Alter et al. |
| 6,917,105 | B2 | 7/2005 | Alter |
| 2001/0013821 | A1 * | 8/2001 | Huang et al. ................ 336/200 |
| 2002/0109204 | A1 * | 8/2002 | Acosta et al. ............... 257/531 |
| 2002/0140081 | A1 | 10/2002 | Chou et al. |
| 2004/0094822 | A1 * | 5/2004 | Yu ............................. 257/531 |
| 2004/0140862 | A1 * | 7/2004 | Brown et al. ................ 333/117 |
| 2004/0222478 | A1 | 11/2004 | Zhang et al. |
| 2004/0222506 | A1 | 11/2004 | Wei et al. |
| 2005/0269668 | A1 | 12/2005 | Zhang |

FOREIGN PATENT DOCUMENTS

| | | |
|---|---|---|
| WO | WO 02/067326 A2 | 8/2002 |

OTHER PUBLICATIONS

"Unitive Design Guidelines", www.unitive.com, 2001, pp. 1-18.

Frommberger, Michael, et al., "Integration of Crossed Anisotropy Magnetic Core Into Toroidal Thin-Film Inductors," IEEE Transactions on Microwave Theory and Techniques, vol. 53, No. 6, Jun. 2005, pp. 2096-2100.

Kim, Sung-Jin, et al., "Realization of High-Q Inductors Using Wirebonding Technology," School of Electronics Engineering, Ajou University, AP-ASIG Proceedings, Aug. 1999, 4 pages.

Long, John R. and Miles A. Copeland, "The Modeling, Characterization, and Design of Monolithic Inductors for Silicon RF IC's," IEEE Journal of Solid-State Circuits, vol. 32, No. 3, Mar. 1997, pp. 357-369.

Soh, H. T., et al., "Through-Wafer Vias (TWV) and their Applications in 3 Dimensional Structures," Proceedings of 1998 International Conference on Solid State Devices and Materials, Sep. 1998, 12 pages.

Tang, Chih-Chun, et al., "Miniature 3-D Inductors in Standard CMOS Process," IEEE Journal of Solid-State Circuits, vol. 37, No. 4, Apr. 2002, pp. 471-480.

Treleaven, Dave and Dick James, "Integrated Circuit Passive Components," Whitepapers, Chipworks, www.chipworks.com/resources/resources_whitepapers.asp, 4 pages.

Tsui, Hau-Yiu and Jack Lau, 2003 IEEE MTT-S Digest, pp. 225-228.

Wu, Joyce H., et al., "A Through-Wafer Interconnect in Silicon for RFICs," IEEE Transactions on Electron Devices, vol. 51, No. 11, Nov. 2004, pp. 1765-1771.

Zannoth, Markus, et al., "A Fully Integrated VCO at 2 GHz," IEEE Journal of Solid-State Circuits, vol. 33, No. 12, Dec. 1998, pp. 1987-1991.

Zou, Jun, et al., Development of Vertical Planar Coil Inductors Using Plastic Deformation Magnetic Assembly (PDMA), 2001 IEEE International Microwave Symposium, May 2001, 4 pages.

Chang, J.Y.-C. et al., "Large Suspended Inductors on Silicon and Their Use in a 2-μm CMOS RF Amplifier," IEEE Electron Device Letters, vol. 14, No. 5, May 1993, pp. 246-248.

Larson, Lawrence and Jessie, Darryl, "Advances in RF Packaging Technologies for Next-Generation Wireless Communications Applications (Invited Paper)," in Proceedings of the Custom Integrated Circuits Conference, IEEE, 8 pages, Sep. 21-24, 2003.

* cited by examiner

ELECTROMAGNETIC SHIELDING STRUCTURE

CROSS-REFERENCE TO RELATED APPLICATION(S)

BACKGROUND

1. Field of the Invention

The present invention relates to integrated circuits, and more particularly to such integrated circuits incorporating shielded inductor structures.

2. Description of the Related Art

Many modern integrated circuit devices, e.g., stable oscillators, require a high-Q (i.e., quality factor) inductor that is immune to external noise sources to achieve desired specifications. Crystal oscillators may be employed, but typically require an off-chip crystal mounted elsewhere on a printed-wiring-board. LC oscillators offer the potential advantage of being able to incorporate such an oscillator on-chip.

To achieve a suitable oscillator for certain applications (e.g. inclusion in a narrow bandwidth phase-locked loop (PLL)), a high-Q (i.e., quality factor) LC oscillator is typically required. For example, a Q>20 may be required for certain applications. It is difficult to achieve such a high-Q with conventional on-chip inductors using conductor and dielectric layer compositions and thicknesses which are typically encountered in traditional integrated circuit processes. In addition, such inductors are susceptible to electromagnetic interference from external sources of noise. For certain applications using LC oscillators, a low bandwidth PLL is desirable to ensure that jitter from a noisy source is not passed to the output. In contrast, high bandwidth PLLs tend to pass input jitter. However, the ability of a PLL to resist the pulling from external noise sources is directly proportional to the loop bandwidth. Inductors inside of the PLL, particularly inside an LC oscillator included in the PLL, are most prone to pulling. Accordingly, it is desirable to shield the inductor from external noise sources, particularly in low bandwidth applications to reduce the possible degradation in performance. Therefore, improvements to high-Q LC oscillators are desired to achieve stable oscillators, particularly for use as low-jitter clock sources.

SUMMARY

An improved electromagnetic shielding structure has been discovered. In one embodiment of the invention, an apparatus includes an inductor and an electrically conductive enclosure that electromagnetically shields the inductor. The electrically conductive enclosure has an aperture at least as large as the inductor. The aperture is substantially centered around a projected surface of the inductor. The apparatus may include one or more electrically conductive links extending across the aperture and electrically coupled to the electrically conductive enclosure. The electrically conductive links reduce an effect of electromagnetic signals external to the electrically conductive enclosure on the inductor.

In one embodiment of the present invention, a method includes reducing a current induced in an electrically conductive enclosure generated in response to an inductor. The induced current generates an electromagnetic field that counteracts an effective electromagnetic field generated by the inductor. The reducing uses at least one aperture in the electrically conductive enclosure. The method may include reducing an effective aperture utilizing links for generating a current that produces an electromagnetic field to counteract at least some external electromagnetic signals entering the electrically conductive enclosure through the aperture.

In one embodiment of the present invention, a method of manufacturing an integrated circuit product includes forming an inductor and forming an electrically conductive enclosure electromagnetically shielding the inductor. The electrically conductive enclosure has an aperture at least as large as the inductor. The aperture is substantially centered around a projected surface of the inductor. The method may include forming one or more electrically conductive links extending across the aperture and electrically coupled to the electrically conductive enclosure. The electrically conductive links reduce an effect of electromagnetic signals external to the electrically conductive enclosure on the inductor.

BRIEF DESCRIPTION OF THE DRAWINGS

The present invention may be better understood, and its numerous objects, features, and advantages made apparent to those skilled in the art by referencing the accompanying drawings.

5A is a cross-sectional view of an inductor structure within an electromagnetic shielding structure in accordance with an embodiment of the present invention.

Figure 5A:
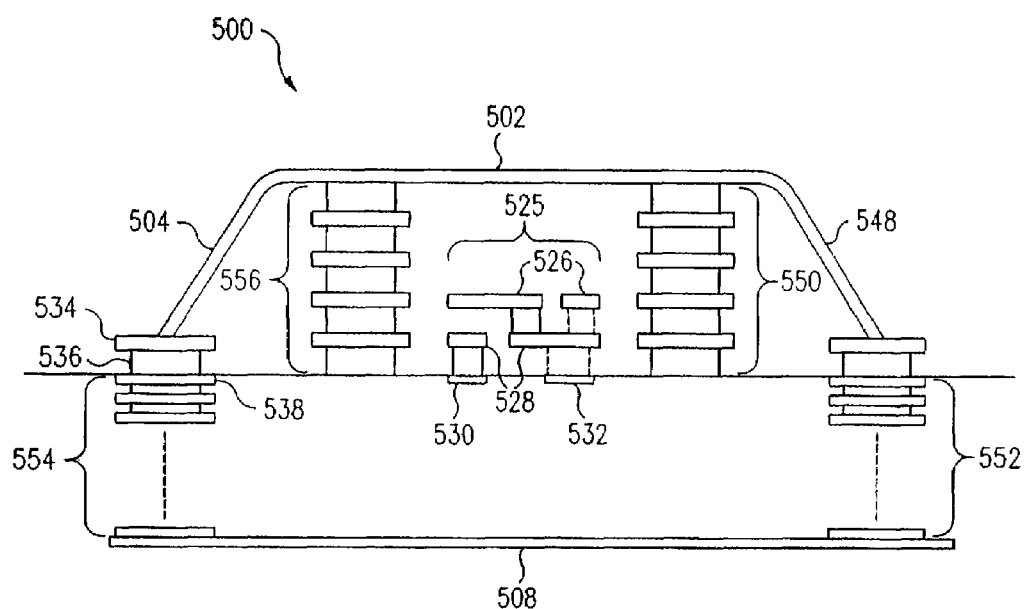
Figure 5B:
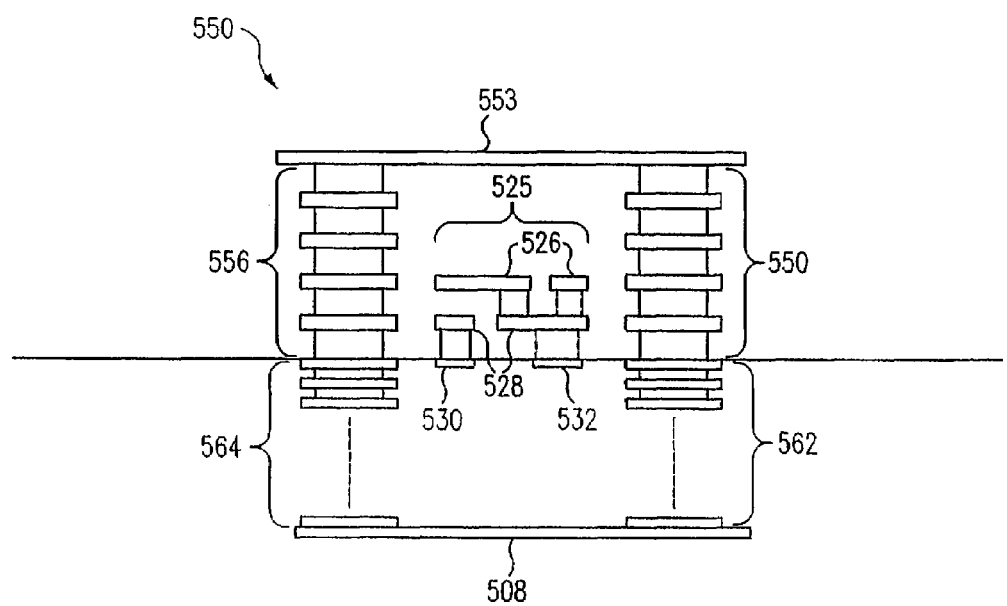

FIG. 5B is a cross-sectional view of an inductor structure within an electromagnetic shielding structure in accordance with an embodiment of the present invention.

Figure 6A:
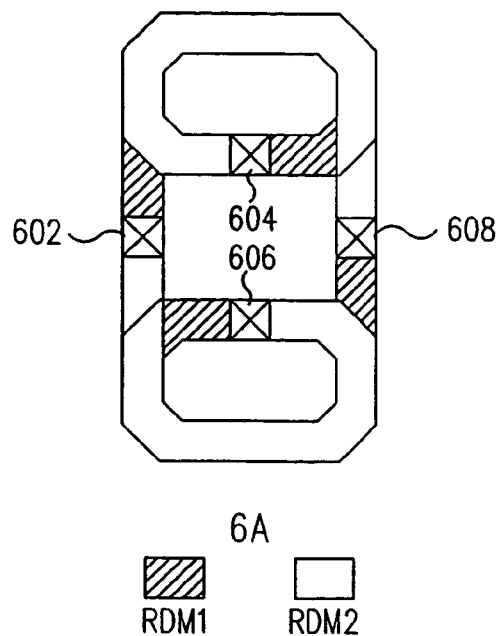

FIG. 6A is a top view of an exemplary inductor structure in accordance with an embodiment of the present invention.

Figure 6B:
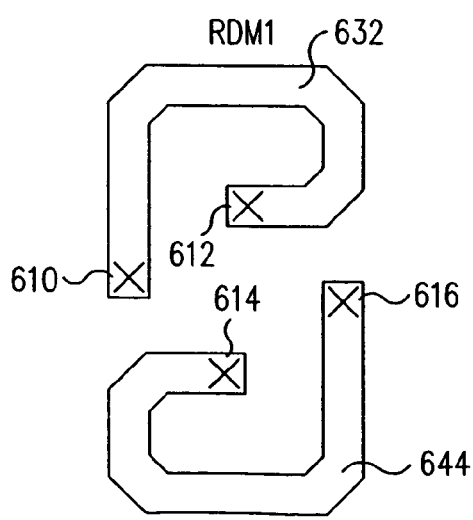

FIG. 6B is a top view of a conductor layer included in an exemplary inductor structure in accordance with an embodiment of the present invention.

Figure 6C:
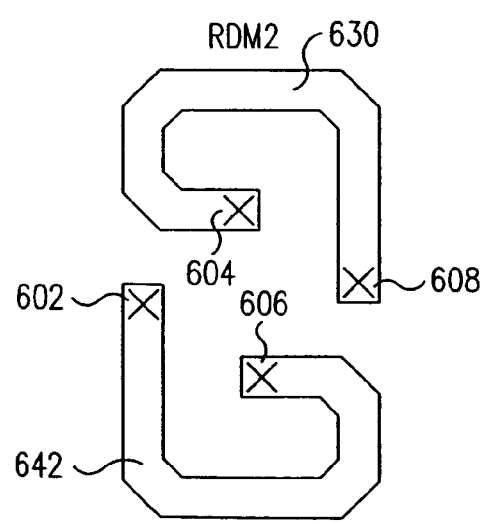

FIG. 6C is a top view of a conductor layer included in an exemplary inductor structure in accordance with an embodiment of the present invention.

Figure 6D:
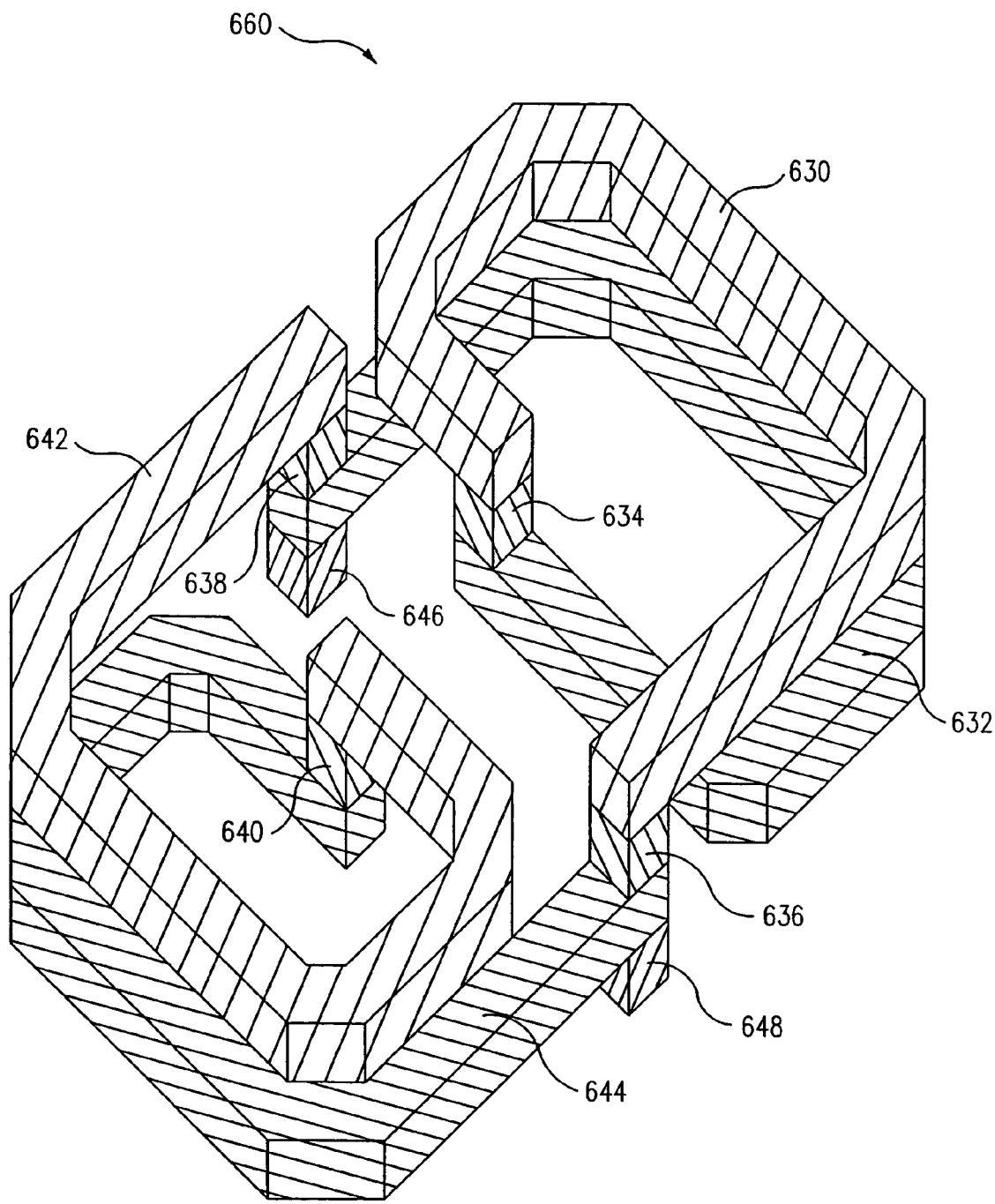

FIG. 6D is a perspective view of an exemplary inductor structure in accordance with an embodiment of the present invention.

Figure 7A:
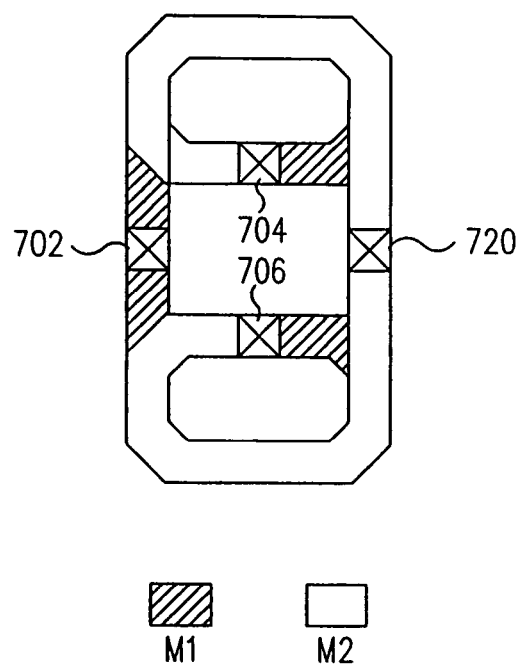

FIG. 7A is a top view of an exemplary inductor structure in accordance with an embodiment of the present invention.

Figure 7B:
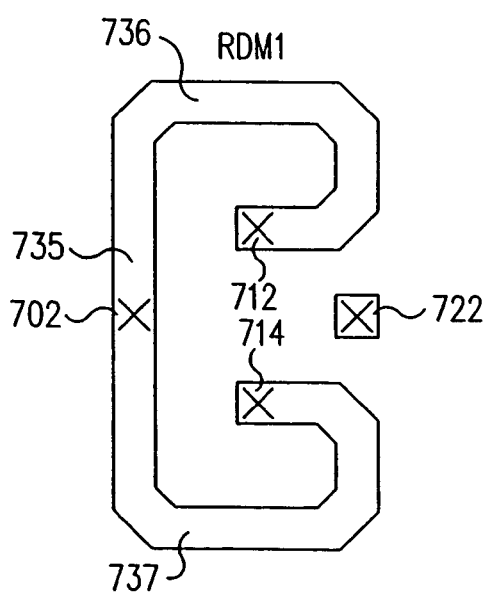

FIG. 7B is a top view of a conductor layer included in an exemplary inductor structure in accordance with an embodiment of the present invention.

Figure 7C:
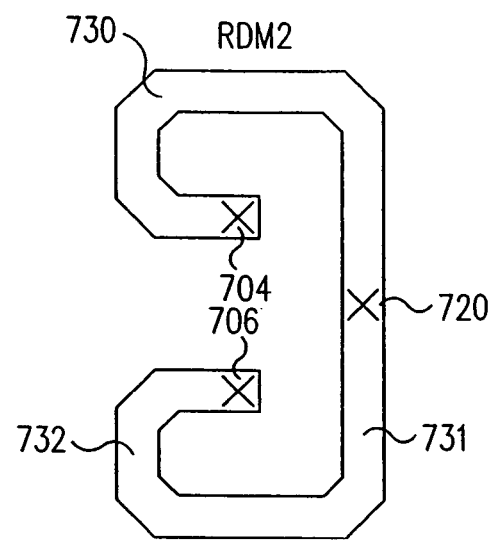

FIG. 7C is a top view of a conductor layer included in an exemplary inductor structure in accordance with an embodiment of the present invention.

Figure 7D:
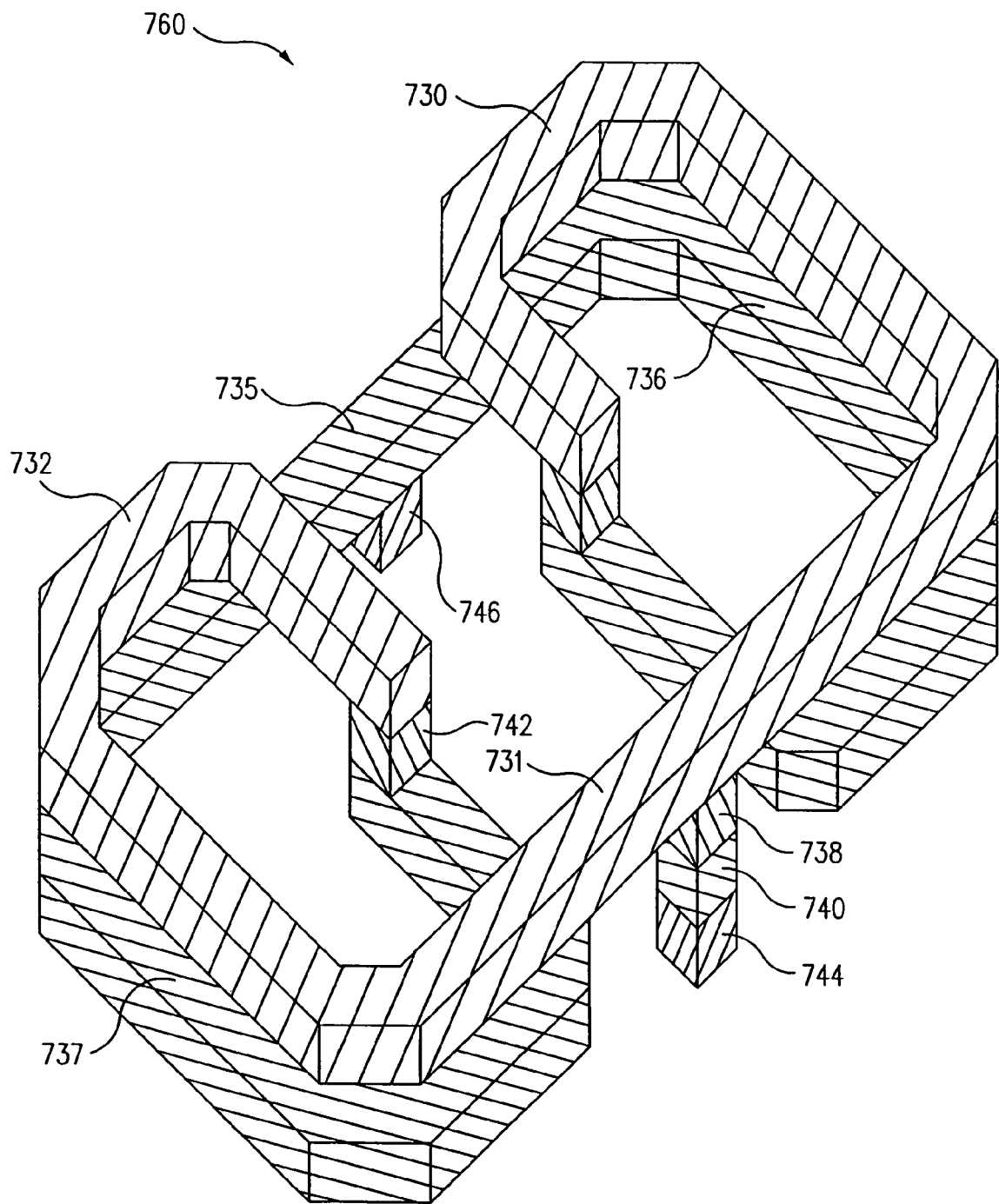

FIG. 7D is a perspective view of an exemplary inductor structure in accordance with an embodiment of the present invention.

Figure 8:
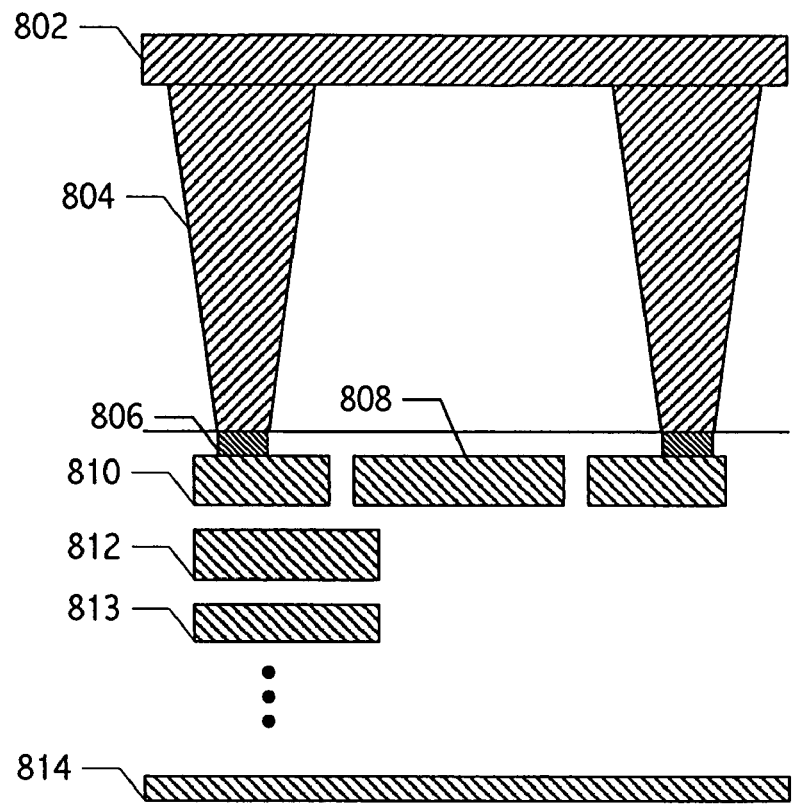

FIG. 8 is a cross-sectional view of an inductor structure within an electromagnetic shielding structure in accordance with an embodiment of the present invention.

Figure 9D:
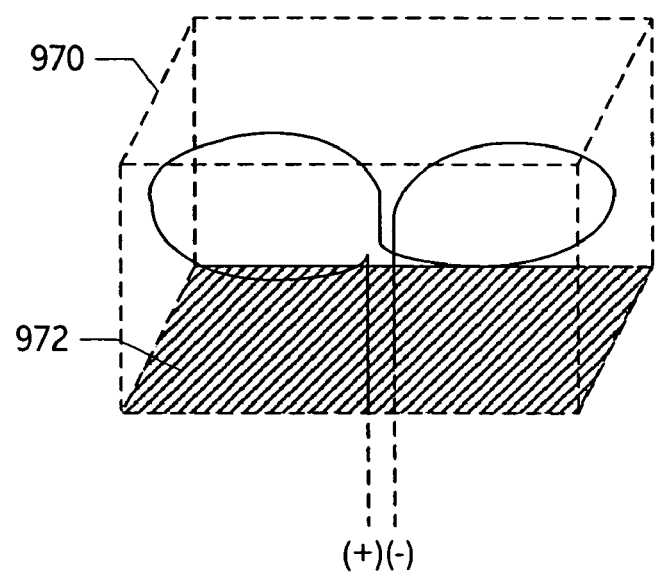
Figure 9A:
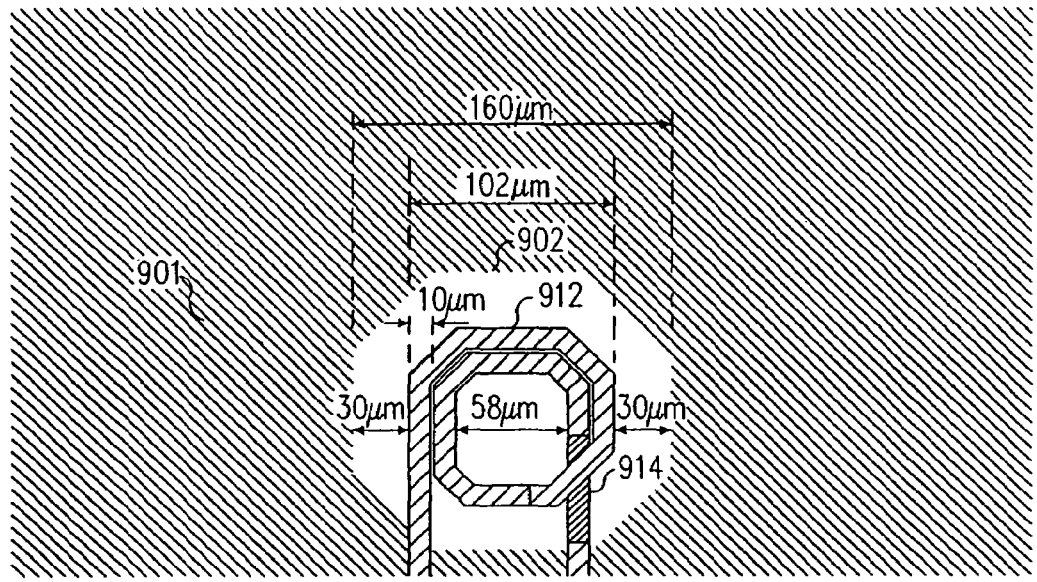

FIG. 9A is a top view of an inductor structure within an electromagnetic shielding structure in accordance with an embodiment of the present invention.

Figure 9B:
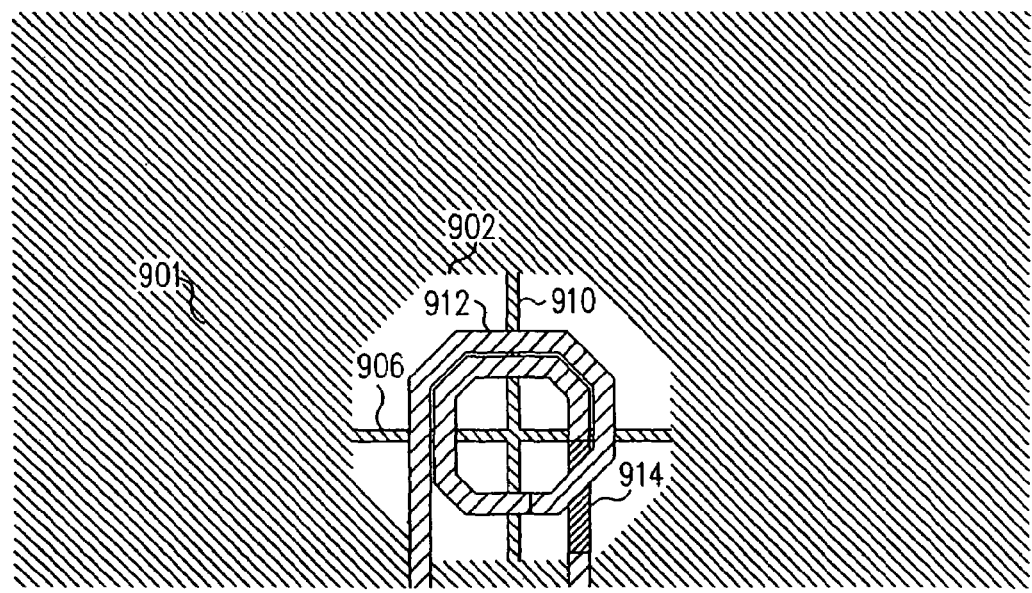

FIG. 9B is a top view of an inductor structure within an electromagnetic shielding structure in accordance with an embodiment of the present invention.

Figure 9C:
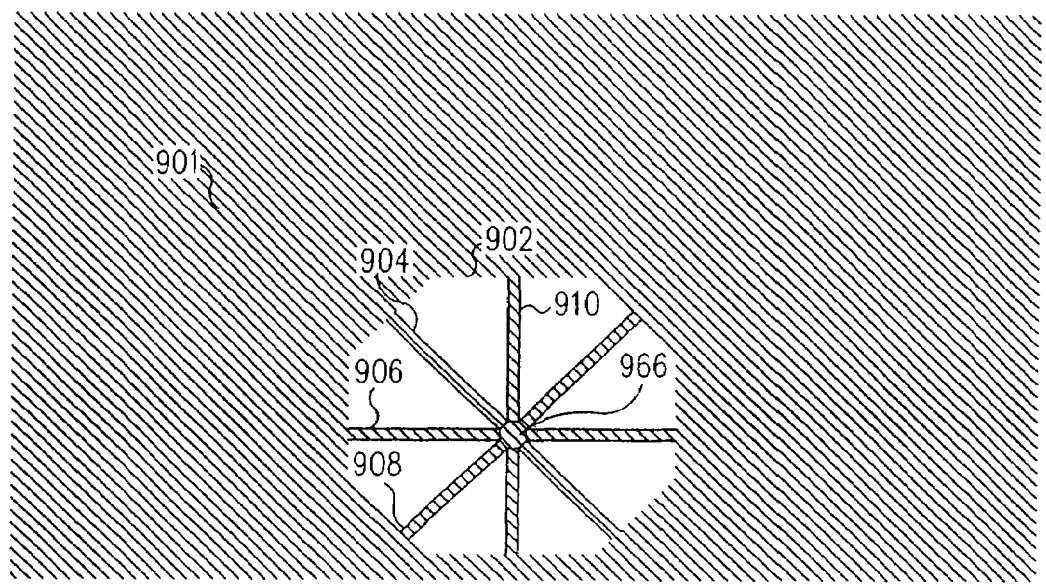

FIG. 9C is a top view of an inductor structure within an electromagnetic shielding structure in accordance with an embodiment of the present invention.

FIG. 9D is a perspective diagram depicting an inductor structure within an electromagnetic shielding structure in accordance with an embodiment of the present invention.

Figure 10:
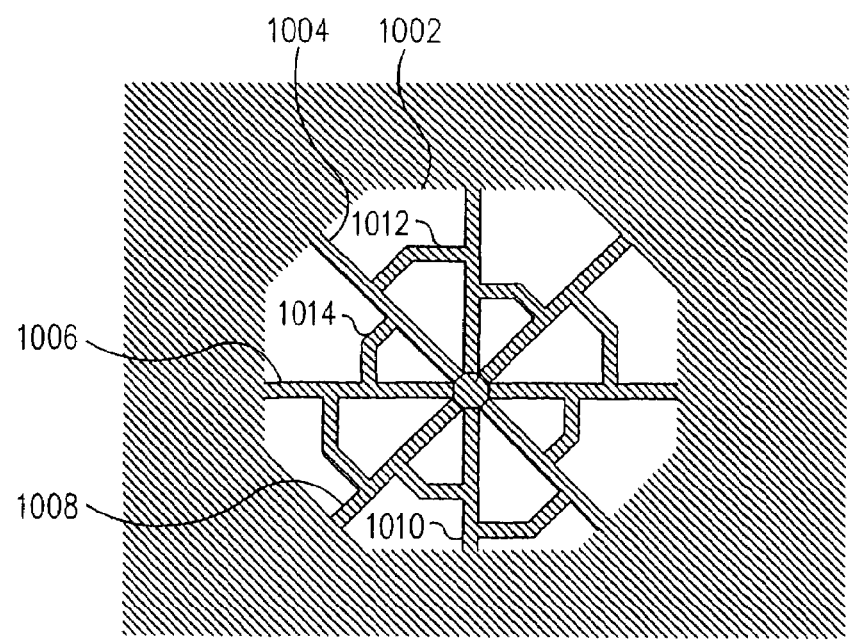

FIG. 10 is a top view of an electromagnetic shielding structure in accordance with an embodiment of the present invention.

Figure 11A:
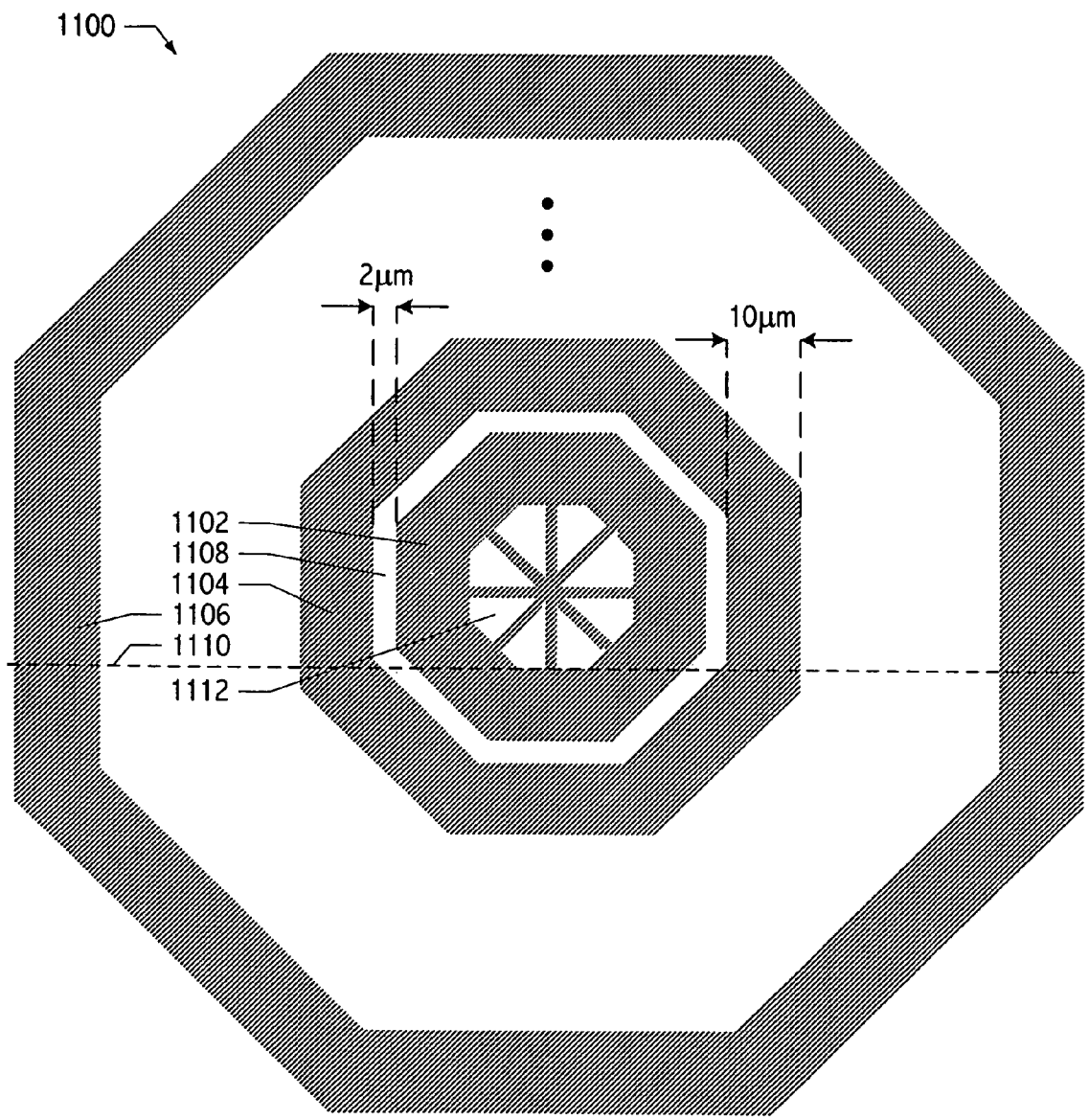

FIG. 11A is a top view of an electromagnetic shielding structure in accordance with an embodiment of the present invention.

Figure 11B:
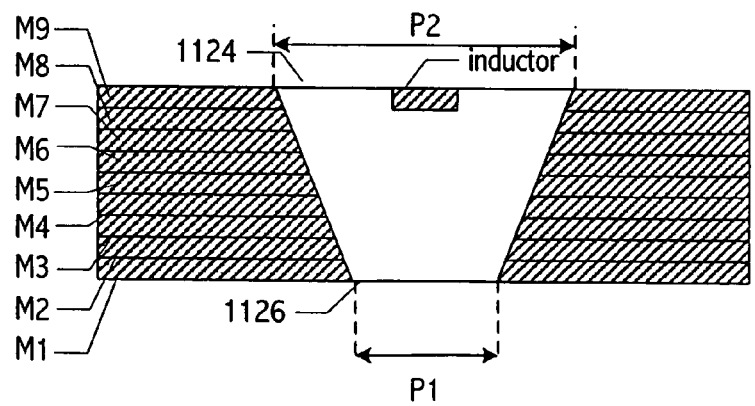

FIG. 11B is a side view of an electromagnetic shielding structure in accordance with an embodiment of the present invention.

The use of the same reference symbols in different drawings indicates similar or identical items.

DESCRIPTION OF THE PREFERRED EMBODIMENT(S)

Figure 1:
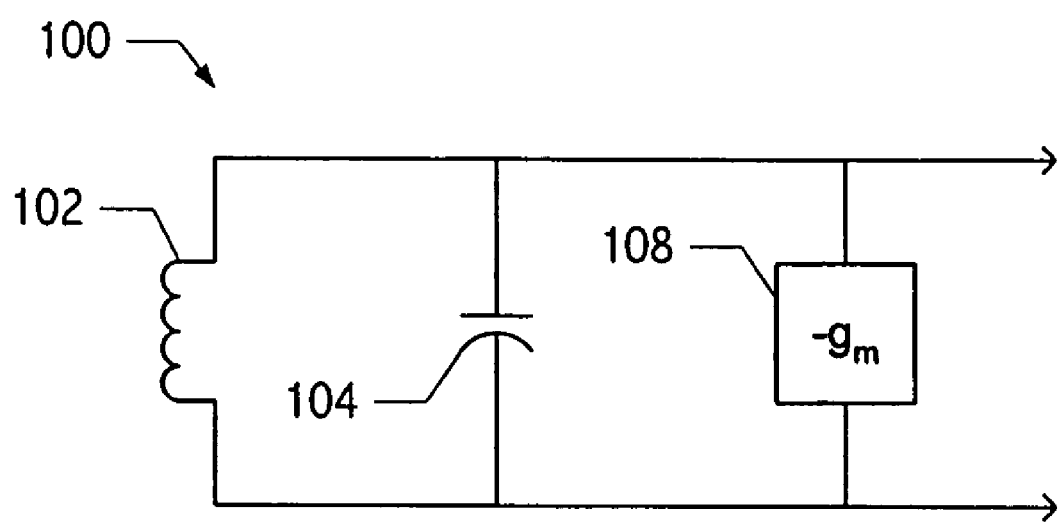
FIG. 1 is a schematic/block diagram of an exemplary LC oscillator circuit in accordance with an embodiment of the present invention.
Figure 2A:
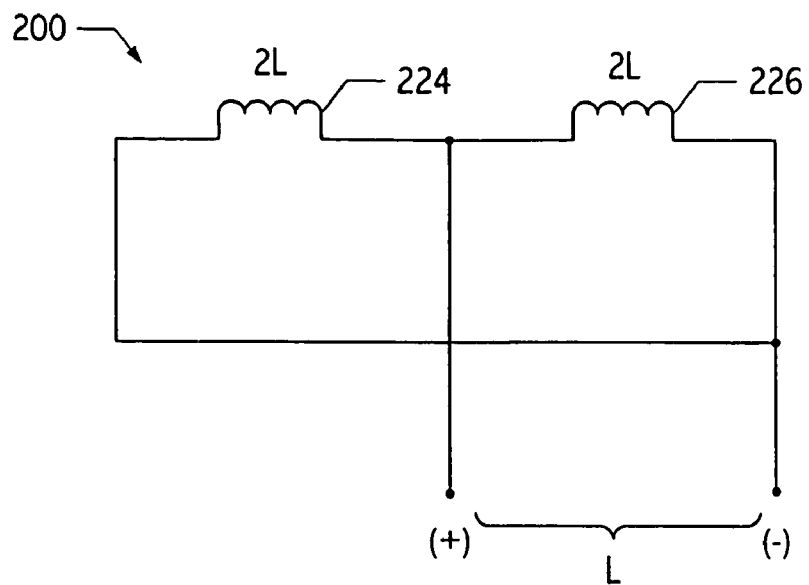
FIG. 2A is a schematic/block diagram of an exemplary inductor structure in accordance with an embodiment of the present invention.
Figure 2B:
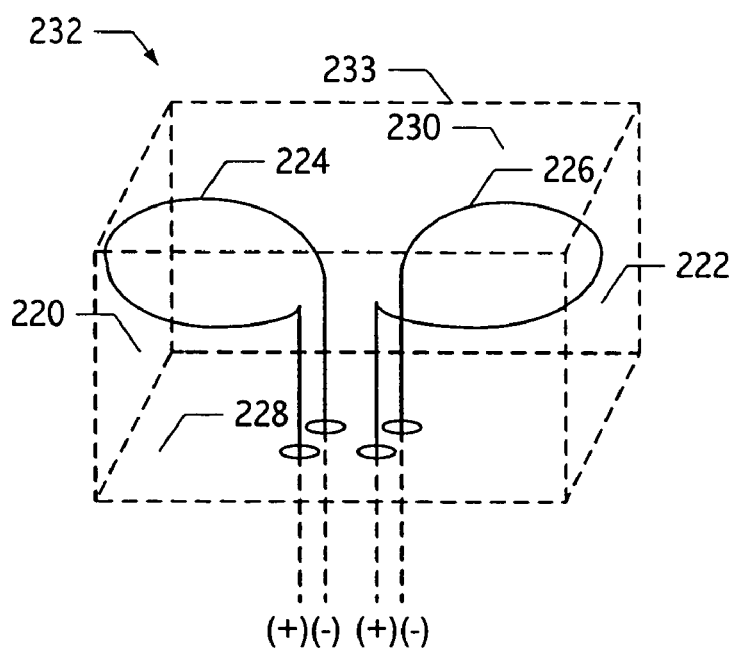
FIG. 2B is a perspective diagram depicting an inductor structure within an electromagnetic shielding structure in accordance with an embodiment of the present invention.
Figure 2C:
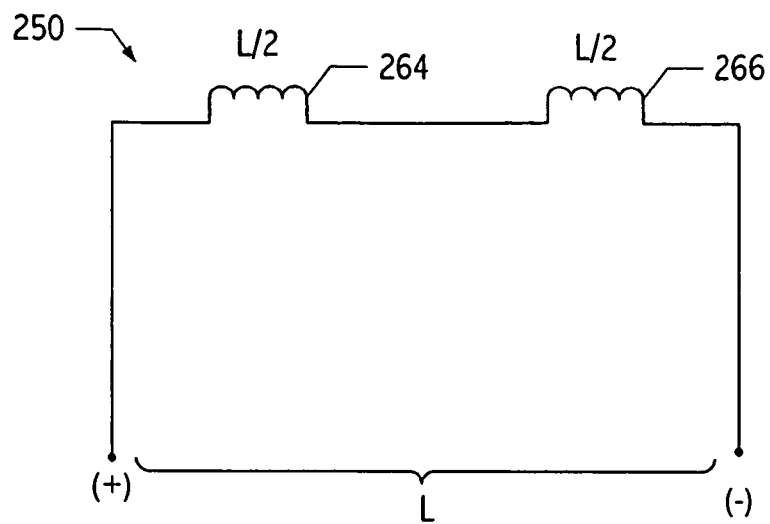
FIG. 2C is a schematic/block diagram of an exemplary inductor structure in accordance with an embodiment of the present invention.
Figure 2D:
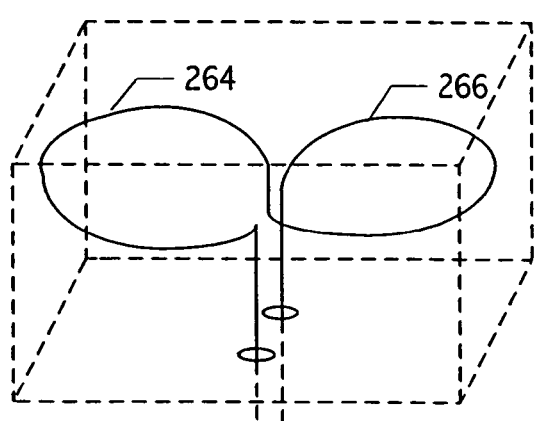
FIG. 2D is a perspective diagram depicting an inductor structure within an electromagnetic shielding structure in accordance with an embodiment of the present invention.

Referring to FIG. 1, an integrated circuit die includes an LC oscillator circuit e.g., circuit 100, including inductor 102, capacitor 104, and gain stage 108. The Q (i.e., quality factor) associated with the resonant circuit describes the ability of the circuit to produce a large output at a resonant frequency and also describes the selectivity of the circuit. The Q of a resonant circuit is inversely related to interference from outside sources. One way to reduce electromagnetic interference affecting an inductor structure includes implementing the inductor structure as a two-loop arrangement. Circuit 200 of FIG. 2A, illustrates two parallel-connected inductor coils (e.g., loops 224 and 226), and circuit 250 of FIG. 2C, illustrates two series-connected inductor coils (e.g., loops 264 and 266). These two-loop arrangements are less susceptible to external electromagnetic interference (e.g., far field interference sources in particular) because induced current flow in one such coil (e.g., loop 224 or loop 264) is offset by an opposite current flow induced in the other coil (e.g., loop 226 or loop 266, respectively).

Another technique for reducing interference that is coupled into a resonant circuit includes shielding the inductor from outside sources of interference. A closed conducting container that reduces the electromagnetic field inside the container generated by external static electromagnetic fields forms a Faraday shield (i.e., Faraday cage) that sufficiently shields the inductor from sources of interference. A typical shielding structure includes a 6-sided electrically-conductive box (e.g., box 233 of FIG. 2B) that effectively forms a Faraday cage around the inductor. The box may be formed of solid plates except for vias on one of its sides (side 228 of FIG. 2B) to allow the inductor leads to pass through for connection to the integrated circuit die.

In response to the electromagnetic field generated by the inductor, the electrically conductive enclosure generates a current (e.g., an eddy current in a top plate, a bottom plate or sidewall of the electrically conductive enclosure) that generates a corresponding electromagnetic field that counteracts the inductor electromagnetic field. The induced current and the induced electromagnetic field are inversely proportional to a function of the distance between the inductor and a plate of the electrically conductive enclosure. The current consumes power that would otherwise be available to the inductor. The induced electromagnetic field reduces the electromagnetic field generated by the inductor. These two effects combined reduce the Q of an LC oscillator including the inductor. The plates of the electrically conductive enclosure (i.e., the top plate, bottom plate, and sidewalls) may be sufficiently spaced from the inductor to reduce the current induced in the plates of the cage. The Faraday cage is grounded at only one point to prevent DC current flow in the Faraday cage.

In an exemplary embodiment, a two-loop inductor structure of the LC tank circuit is fabricated as a shielded inductor structure. To provide adequate electromagnetic shielding, conductors used to form the shield structure should be much thicker than the skin depth (δ) corresponding to the target frequency, and the conductors should be of high conductivity to reduce eddy current losses (e.g., shield power consumption and reduction in inductor flux). Referring to FIG. 2B, Faraday cage 233 may be formed partially in traditional integrated circuit layers, i.e., conductor and dielectric layer compositions having thicknesses which are typically encountered in traditional integrated circuit processes. Faraday cage 233 is also formed partially in redistribution layers. Redistribution layers may be any layers formed on the integrated circuit used to route electrical connections between contact pads on an IC die and a location of a package contact. This may include depositing and patterning metal layers to transform an existing input/output layout into a pattern that satisfies the requirements of a solder bump design.

The redistribution layers are typically formed above a passivation layer, i.e., a layer formed on an integrated circuit to provide electrical stability by protecting the integrated circuit from moisture, contamination particles, and mechanical damage. The passivation layer may include silicon dioxide, silicon nitride, polyimide, or other suitable passivation materials. Redistribution layers are typically formed above integrated circuit bonding pads. These pads, typically coupled to an electronic device formed in the integrated circuit, may include aluminum, copper, titanium, or other suitable material. However, redistribution layers may include additional dielectric and conductive layers formed on an integrated circuit die in the absence of a passivation layer or bonding pads.

Redistribution layers typically have thicknesses substantially greater than the thicknesses of typical dielectric and conductive layers formed on an integrated circuit die. For example, a typical conductive layer in an integrated circuit is less than 1 μm thick and corresponding dielectric layers are also less than 1 μm thick. However, conductive layers in an exemplary redistribution layer are at least 2 μm thick and corresponding dielectric layers are at least 5 μm thick. In another embodiment, the dielectric layers are at least 15 μm thick. Redistribution dielectric layers may include silicon nitride, oxynitride, silicon oxide, benzocyclobutene (BCB), polyimide, or other suitable materials. Redistribution conductive layers may include aluminum, copper, or other suitable materials.

In an exemplary embodiment, Faraday cage 233 includes a solid top plate 230, formed in a conductive redistribution layer. Top plate 230 may be formed from a redistribution conductor layer (e.g., copper or aluminum) or under bump metallurgy. Under bump metallurgy typically provides a connection between a solder bump and a contact pad and provides a surface to which solder will adhere. The under bump metallurgy may include titanium, copper, nickel, gold, chromium and/or other suitable materials.

The bottom plate of Faraday cage 233 (i.e., bottom plate 228) is generally formed in a conductor of the integrated circuit die, i.e., a traditional integrated circuit layer or, preferably, in another conductive redistribution layer. In an exemplary embodiment, the bottom plate is formed in the first metal layer of the process technology (e.g., metal-1). However, the bottom plate may be formed in any other suitable conductive layer formed on the integrated circuit die (e.g., a traditional integrated circuit layer or a redistribution layer).

The four sidewalls of Faraday cage 233 (e.g., sidewall 220 and sidewall 222) are formed on the integrated circuit die, at least partially in redistribution layers. The sidewalls of an exemplary Faraday cage are formed partially in the typical integrated circuit layers and partially in the redistribution layers, approximated by a plurality of conductive via structures. In a typical integrated circuit process, metal layers are electrically coupled to adjacent metal layers (e.g., metal-1 is coupled to metal-2) by vias in a dielectric layer between the metal layers. Those vias are filled with conductive material.

Figure 3:
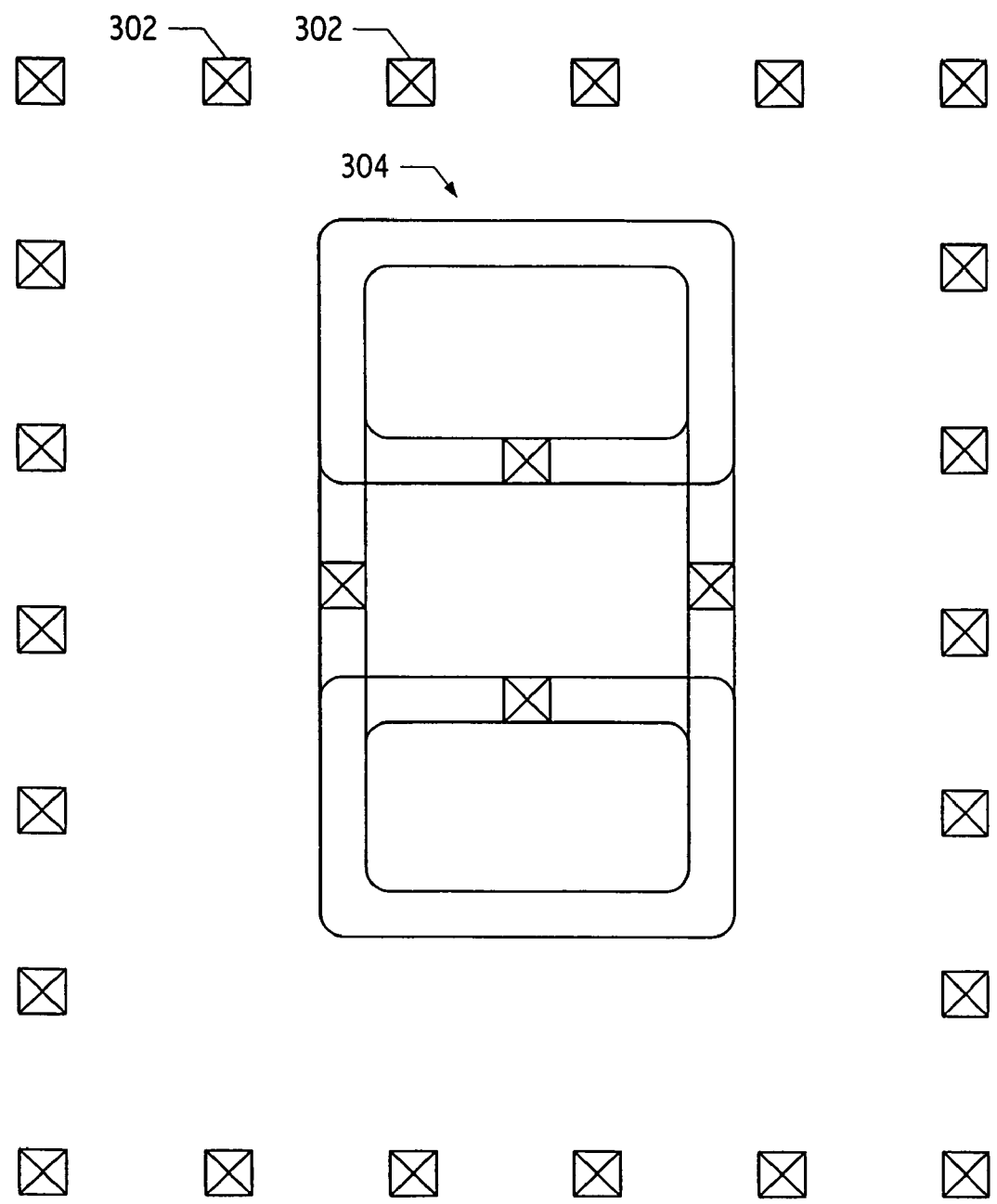
FIG. 3 is a top view of an embodiment of the structures depicted in FIGS. 2A-2D.
Figure 4A:
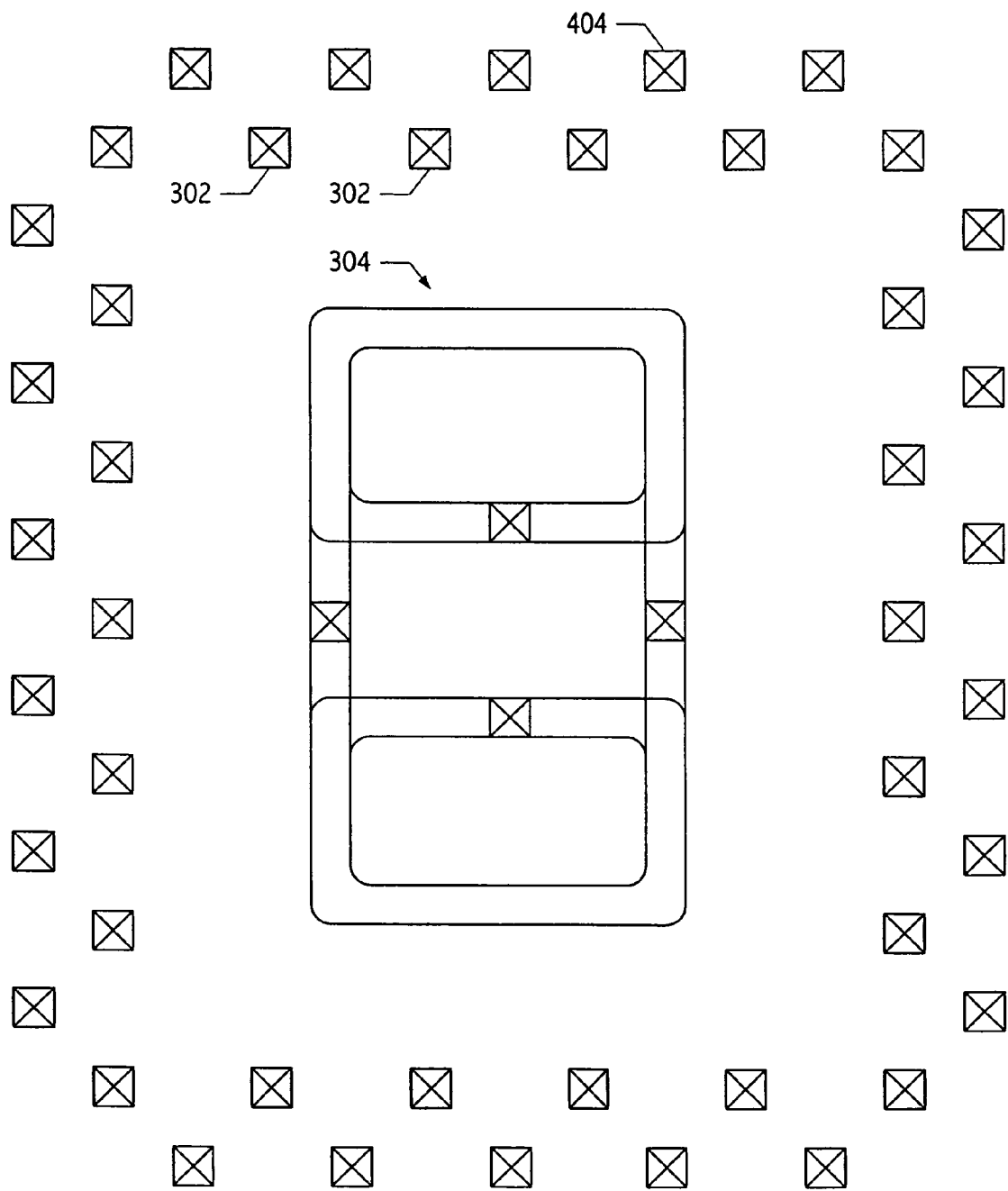
FIG. 4A is a top view of an embodiment of the structures depicted in FIGS. 2A-2D.

Referring to FIG. 3, a top view of an inductor structure is illustrated. Inductor structure 304 is surrounded by sidewalls of an effective Faraday cage. Preferably, the vias are continuous, solid walls, but, discrete vias, e.g., vias 302, may be spaced a minimum distance apart and placed around the perimeter of the box. In an exemplary embodiment, additional rows of vias are staggered from the first rows of vias and are placed around the first set of vias, but in the same layer of vias, as shown in FIG. 4A, to further reduce the effective size of apertures formed between adjacent vias and to further attenuate any electromagnetic radiation of particular frequencies entering or leaving the shielding Faraday cage. The vias in the typical integrated circuit process may be stacked on top of each other. Referring to FIG. 4D, metal-1 (e.g., metal layer 492) is coupled to metal-2 (e.g., metal layer 488) by a via (e.g., via 490) and metal-2 is coupled to metal-3 (e.g., metal layer 484) by a via (e.g., via 486) stacked above the via coupling metal-1 and metal-2. However, vias in the typical integrated circuit layers may be formed without stacking adjacent vias, by staggering vias of adjacent layers, as illustrated in FIGS. 4B and 4C.

Figure 4B:
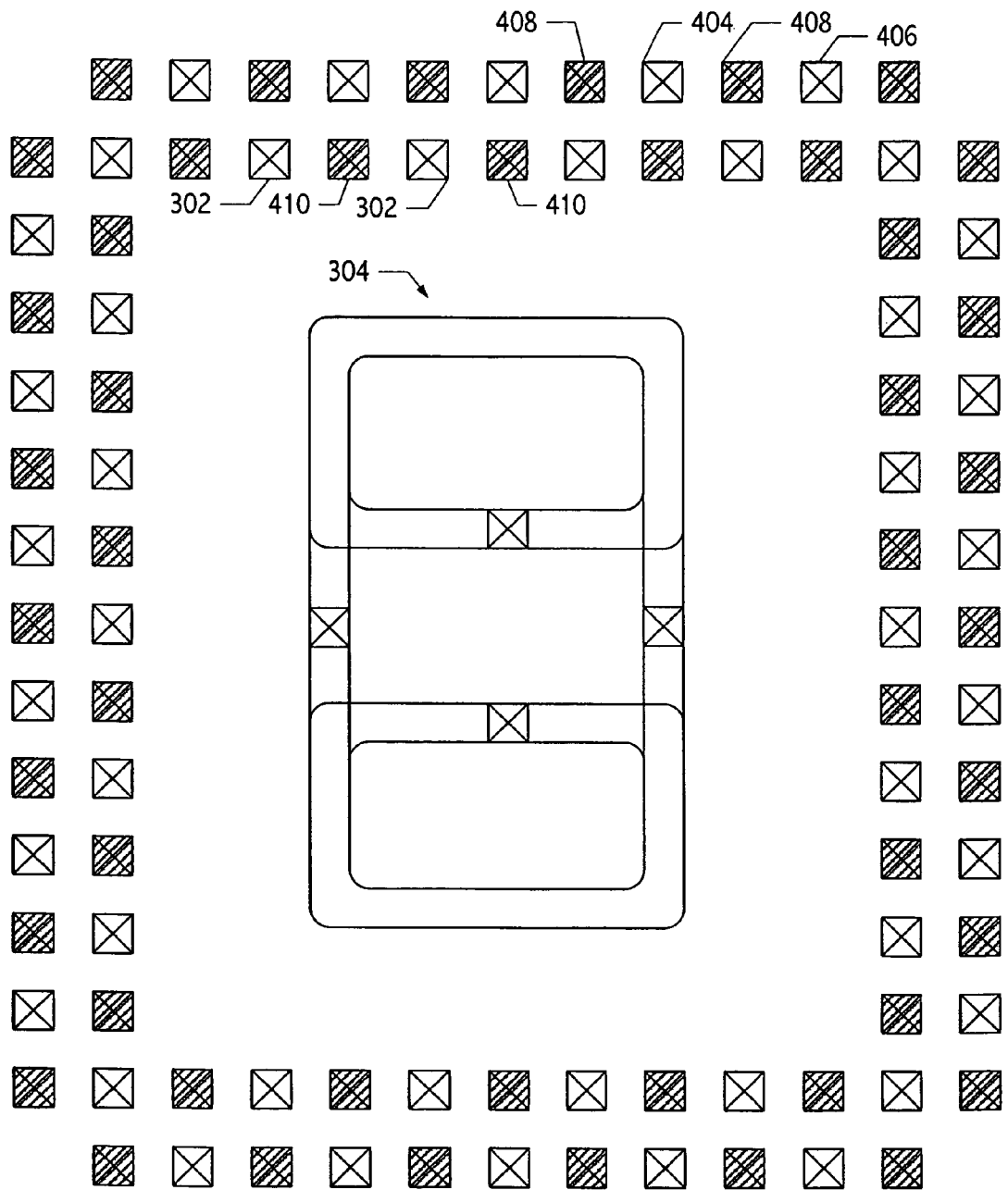
FIG. 4B is a top view of an embodiment of the structures depicted in FIGS. 2A-2D.
Figure 4C:
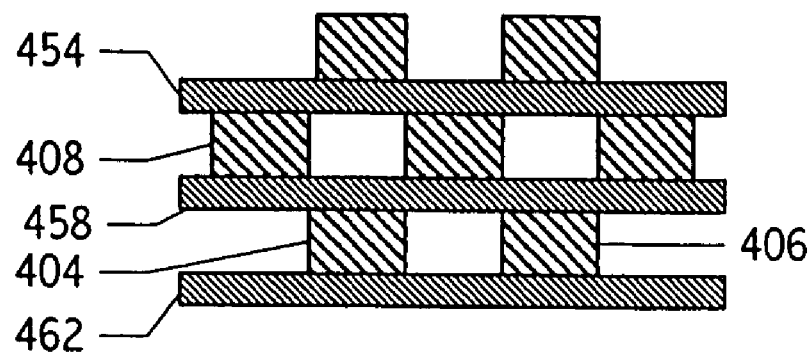
FIG. 4C is a cross-sectional view of an embodiment of the structures depicted in FIG. 4B.
Figure 4D:
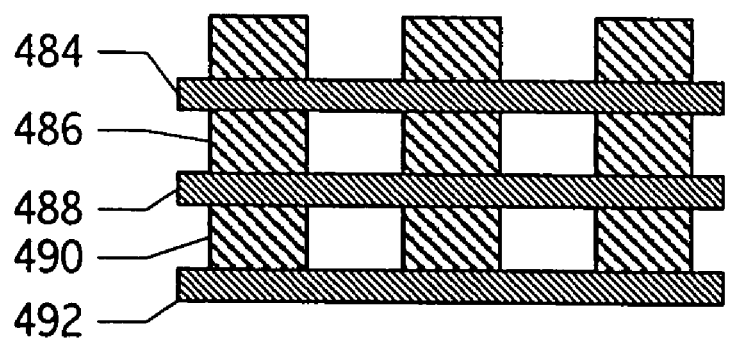
FIG. 4D is a cross-sectional view of an embodiment of the structures depicted in FIG. 4A.

Referring to FIG. 4B, instead of stacking a second layer of vias on top of a first layer of vias (e.g., the first layer of vias including vias 302 and 404), vias in the next adjacent layer (e.g., vias 408 and 410) are formed staggered from a location that would stack the vias above vias in the first layer. For example, in a stacked configuration, vias 408 would be formed stacked above vias 404 and 406; vias 410 would be formed stacked above vias 302. Instead, vias 408 and 410 are not formed directly above vias formed in the next adjacent layer of vias. Referring to FIG. 4C, vias 404 and 406 couple metal layer 462 to metal layer 458, e.g., coupling metal-1 to metal-2, respectively. Via 408 couples metal layer 458 to metal layer 454, e.g., coupling metal-2 to metal-3, respectively.

In an exemplary embodiment, rows of vias in the typical integrated circuit layers are electrically coupled to via structures formed in redistribution layers. The via structures in the redistribution layers may be spaced a minimum distance apart and placed around the perimeter of the box, as illustrated in FIG. 3. Additional rows of vias may be staggered from the first rows of vias and placed around the first set of vias, as shown in FIGS. 4A and 4D. The via structures in the redistribution layers may be stacked on top of each other. In addition, vias in the redistribution layers may be formed without stacking adjacent vias, by staggering vias of adjacent layers, as illustrated in FIGS. 4B and 4C.

Referring to FIG. 5A, an exemplary integrated circuit die cross-section 500 illustrates a Faraday cage surrounding an inductor structure. The Faraday cage includes top plate 502 formed in a redistribution layer by, e.g., under bump metallurgy. Bottom plate 508 and sidewall portions 554 and 552 are formed in typical integrated circuit layers. Support structures 556 and 550 are formed in redistribution layers. Although bottom plate 508 is illustrated as formed in a first metal layer of the typical integrated circuit process, bottom plate 508 may be formed with a combination of a first and second metal layer of the typical integrated circuit process, in a redistribution layer, or in any other suitable layer or combination of layers. In the illustrated embodiment, inductor structure 525 is formed in the first two conductive redistribution layers 526 and 528. Inductor structure 525 is electrically coupled to other circuitry on the integrated circuit die by contacts 530 and 532. However, the inductor structure may be formed in any suitable redistribution layers, typical integrated circuit layers, or any combination thereof.

In an exemplary embodiment, rows of vias in the typical integrated circuit layers, e.g., rows 554 and 552, are electrically coupled to sidewalls formed in a structure formed of under bump metallurgy (e.g., sidewalls 504 and 548). These sidewalls are formed by a non-planar layer of under bump metallurgy (e.g., the non-planar layer including top-plate 502 and sidewalls 504 and 548) that is supported by via structures e.g., support structures 556 and 550, formed in the redistribution layers. The sidewalls are coupled to portions of the Faraday cage formed in the typical integrated circuit layers, e.g., by coupling metal layer 534 in the redistribution process to metal layer 538 in the typical integrated circuit process with conductive via 536.

Referring to FIG. 5B, another exemplary integrated circuit die cross-section 550 illustrates a Faraday cage surrounding an inductor structure (i.e., inductor 525). Top plate 553 is formed in a redistribution layer by, e.g., under bump metallurgy. Sidewalls 556 and 550 are formed in redistribution layers. Rows of vias in the typical integrated circuit layers, e.g., rows 564 and 562, are electrically coupled to sidewalls 556 and 550.

An exemplary Faraday cage measures 120 μm from sidewall to sidewall, surrounding a 100 pH inductor. The distance of the shielding structure from the inductor affects the resulting inductance and inductor Q. The smaller the distance, the smaller the effective inductance and the greater the loss. Typically, the sidewalls are easily positioned far enough from the inductor to reduce the effect of the sidewalls on the inductance and the inductor Q to achieve an acceptable Q. In an exemplary embodiment, the distance is approximately half the diameter of the inductor loop. In general, the inductor Q decreases at a faster rate than the inductance with decreases in distance. Forming the inductor at least partially in redistribution layers may be beneficial because the dielectric and metal layers are thicker than traditional integrated circuit layers, which facilitates achieving a sufficient distance between the inductor and the top and bottom plates of the shielding structure.

The inductor structure may be formed entirely or partially within the traditional integrated circuit layers. However, in an exemplary embodiment of the present invention, an improved Q may be achieved by forming the inductor in redistribution layers formed on the integrated circuit die, as illustrated in FIGS. 5A and 5B. The two-loop inductor is formed in two redistribution metal layers (e.g., RDM1 and RDM2). A top-view of a realization of the inductor structure is illustrated in FIGS. 6A-6C. Contacts 610 and 616 couple the inductor to other circuit elements. Contacts 602 and 608 couple RDM1 to RDM2. Contacts 604 and 606 couple RDM1 to contacts 612 and 614 in RDM2, forming the turns of the inductor.

An exemplary inductor includes two turns per loop, although an inductor including any number of turns per loop may be used. For a given inductance, an increase in the number of turns better confines an electromagnetic field produced by the loop because the physical size of the inductor is smaller, thus reducing the likelihood of interference from external electromagnetic fields. Concentrating the electromagnetic field generated by the inductor close to the inductor reduces distances between the top and bottom plate of the Faraday cage and the inductor necessary to achieve a particular Q. However, an increase in the number of turns increases the number of layers required to form the inductor on an integrated circuit die. In one embodiment of the present invention, the two inductor loops are formed in a planar configuration, i.e., the two loops are formed in corresponding layers on the integrated circuit die and the turns are formed in a vertical configuration, i.e., in multiple, distinct layers of the integrated circuit die. However, the inductor loops may be formed in other configurations, e.g., a vertical configuration, with the plates of the Faraday shield placed accordingly.

A three-dimensional view of the conductive layers of the inductor structure is illustrated in FIG. 6D. The current flows symmetrically through inductor structure 660. For example, if the current flows into the inductor through interconnect 646, the current flows out of the inductor through interconnect 648. Current flows from interconnect 646 into RDM1, i.e., conductor 632, and clockwise through conductor 632. Current also flows up into interconnect 638, into RDM2, i.e., conductor 642, and counterclockwise through conductor 642. Current flows down into RDM1, e.g., conductor 644, through conductor 640, and counterclockwise through conductor 644. Current flows from RDM1 into RDM2, i.e., from conductor 632, through conductor 634, clockwise through conductor 630 and down through conductors 636, 644, and 648, and out of the inductor structure 660. In inductor structure 660, for each current path in a first direction through a conductor layer, a current path in an opposing direction exists through a second structure formed in the same conductor layer.

Another exemplary inductor structure may be formed in redistribution layers, as illustrated in FIGS. 7A-7D. This inductor structure also includes symmetrical current paths. The two-loop inductor is formed in two redistribution metal layers (e.g., RDM1 and RDM2). A top-view of a realization of the inductor structure is illustrated in FIGS. 7A-7C. Contacts 702 and 722 couple the inductor to other circuit elements. Contacts 712, 714, and 722 couple RDM1 to contacts 704, 706, and 720 of RDM2. A three-dimensional view of the conductive layers of the inductor structure is illustrated in FIG. 7D. The current flows substantially symmetrically through inductor structure 760. For example, if the current flows into the inductor through interconnect 746, the current flows out of the inductor through interconnect 744. Current flows from interconnect 746 into RDM1, i.e., conductor 735, counterclockwise through branch 737 of conductor 735, and clockwise through branch 736 of conductor 735. The current flows up through conductors 734 and 742 into RDM2. The current then flows clockwise through branch 730 of conductor 731 and counterclockwise through branch 732 of conductor 731. Then the current flows down through conductors 738, 740, and 744 out of the inductor structure.

In an exemplary redistribution and integrated circuit process, if the average distance of a copper top plate and a copper bottom plate from the inductor is dim, an exemplary inductor has a Q greater than d at 10 GHz. Referring back to FIG. 5, inductor 525 is positioned substantially equidistant between the top plate 502 and bottom plate 508. For example, the inductor has a Q greater than 10 at 10 GHz when the top of the inductor (e.g. conductor 526) is 10 μm from the top shield (e.g., top plate 502) and the bottom of the inductor (e.g., conductor 528) is 12 μm from the bottom shield (bottom plate 508). Thus, the preferred distances from the top and bottom plates to respective ones of the top and bottom of the inductor structure, may vary from each other (e.g., to account for varying resistivities of the top and bottom plates). An exemplary inductor formed using the same process technologies has a Q greater than 5 at 10 GHz when the inductor is 5 μm from the top shield and the bottom of the inductor is 6 μm from the bottom shield. Metal-1 layers may be relatively thin compared to, e.g., the metal layers in the redistribution layers and the increased resistivity of metal-1 requires that the inductor be spaced a greater distance from it to maintain an acceptable Q. Although exemplary inductors are described as being formed in the first two redistribution metal layers, other layers may be used. Designation of a structure to a particular layer may vary with the height of the metal layers of the particular redistribution process and typical integrated circuit process.

In another embodiment, the inductor structure may be formed in the traditional layers of the integrated circuit. For example, the inductor may be formed in the one or more top metal layers. One difficulty with placing the inductor in the traditional metal layers is that it reduces the distance to the bottom plate and therefore allows eddy currents formed in the bottom plate to have a greater detrimental influence on the Q of the inductor. In order to increase the distance, in one embodiment, ultra-thick layers may be used.

In one embodiment, the inductor structure may be formed in an ultra-thick layer on an integrated circuit die. Ultra-thick layers include additional dielectric and conductive layers formed on an integrated circuit die below any passivation layer and below any integrated circuit bonding pads, if present. However, ultra-thick layers may be formed on an integrated circuit die in the absence of a passivation layer or bonding pads. Ultra-thick layers typically have thicknesses substantially greater than the thicknesses of typical dielectric and conductive layers formed on an integrated circuit die. For example, a typical conductive layer in an integrated circuit is less than 1 μm thick. However, conductive layers in an exemplary ultra-thick layer are at least 3.3 μm thick and corresponding dielectric layers are at least 0.65 μm thick. Ultra-thick dielectric layers may include silicon nitride, oxynitride, silicon oxide, or other suitable materials. Ultra-thick conductive layers may include aluminum, copper, or other suitable materials. In one embodiment of the present invention, ultra-thick layers are separated from traditional integrated circuit layers by a transitional layer or layers that improve manufacturability. A transitional conductive layer has a thickness less than a thickness of an ultra-thick layer, but greater than a thickness of a traditional layer. Transitional layers may include a conductive layer and a dielectric layer and may be formed of any suitable material (e.g., silicon nitride, oxynitride, silicon oxide, aluminum, copper, polysilicon).

Referring to FIG. 8, an exemplary inductor (e.g., inductor 808) is formed in an ultra-thick layer. Inductor 808 is 10.251 µm above a first metal layer, e.g., metal layer 814 formed in a typical integrated circuit layer. Metal layer 814 forms a bottom plate of a Faraday shield surrounding the inductor structure. Ultra-thick layer 810 is a ninth metal layer (i.e., UTM9) formed on integrated circuit 800. Below ultra-thick metal layer 810 is another ultra-thick metal layer (i.e., UTM8, e.g., metal layer 812). Below ultra-thick metal layer 812 is at least one transitional layer 813, formed where a seventh typical integrated circuit metal layer would otherwise be formed in an exemplary process. The transitional metal layers are formed above six typical integrated circuit metal layers (not shown). Inductor 808 is 10.875 µm below a conductive redistribution layer (e.g., conductive redistribution layer 802), which forms a top plate of the Faraday shield surrounding the inductor structure. Sidewalls 804 are formed in redistribution layers and in one embodiment are 50 µm wide at the interface to layer 802, and 35 µm-20 µm wide at the interface to via 806.

A top view of an exemplary inductor structure (i.e., the inductor structure formed by conductive traces 912 and 914) formed substantially in a single ultra-thick conductive layer is illustrated in FIG. 9A. Conductive traces 912 and 914 form a two-Final turn 260 pH inductor. In some embodiments, two of these inductors may be coupled in parallel to form a 130 pH inductor. Conductive traces 912 and 914 are 10 µm wide and formed in UTM9 and UTM8, respectively. Forming the inductor in UTM9 and UTM8 reduces the achievable distance of the inductor from the bottom shield of the exemplary Faraday cage as compared to the distance achievable if the inductor is formed at least partially in redistribution layers. The reduction in distance decreases the Q of an LC oscillator including the inductor to approximately greater than 8 at 10 GHz. If an ultra-thick metal layer were not used, the Q would be even further decreased because the inductor would be several microns closer to the bottom plate.

In response to the electromagnetic field generated by the inductor, the electrically conductive enclosure that electromagnetically shields the inductor generates a current (e.g., an eddy current in a top plate, a bottom plate or sidewall of the electrically conductive enclosure) that generates a corresponding electromagnetic field that counteracts the inductor electromagnetic field. The induced current and the induced electromagnetic field are inversely proportional to the distance between the inductor and a plate of the electrically conductive enclosure. The current consumes power that would otherwise be available to the inductor. The induced electromagnetic field reduces the electromagnetic field generated by the inductor. These two effects combined reduce the inductance and Q of an LC oscillator including the inductor. In addition to the advantage of ultra-thick layers giving more distance between the inductor and the bottom plate, the current generated in the electrically conductive enclosure in response to the inductor may be further reduced and a corresponding improvement to the Q of an LC oscillator including the inductor may be achieved by including one or more apertures (e.g., aperture 902) in one or more plates of the Faraday cage (e.g., bottom plate 901).

The aperture may be formed in a top plate, a bottom plate or sidewall of the electrically conductive enclosure according to the need for improvement in Q. In an exemplary process, the available vertical distance is limited, whereas sidewalls are more easily spaced to prevent the inductor from inducing a significant current in the sidewalls. Thus, aperture 902 is located in bottom plate 901 of the electrically conductive enclosure, although aperture positioning is not limited thereto. Bottom plate 901 is formed in a first traditional metal layer and a second traditional metal layer (e.g., metal-1 and metal-2). However, bottom plate 901 may be formed in any other traditional metal layer, an ultra-thick metal layer, a redistribution metal layer, other suitable materials, or any combination thereof. Although aperture 902 is placed below and substantially centered around an inductor formed substantially in an ultra-thick metal layer, a circuit element requiring electromagnetic shielding formed in traditional integrated circuit layers, redistribution layers, a package substrate, or any combination thereof and other suitable structures, may receive the benefits of an aperture appropriately placed in an electromagnetic shielding structure including an electrically conductive enclosure having a top plate, bottom plate, and sidewalls, or any other appropriate electromagnetic shielding structure.

Aperture 902 is substantially parallel to the current flow through inductor 912. Aperture 902 is larger than the inductor by approximately one half the diameter of the inductor and separates the inductor from the shield by approximately half of an inner diameter of the inductor, were the inductor projected into the same plane as the shield. An effective diameter, i.e., a diameter between two opposing linear surfaces of the aperture, may be determined by adding approximately an approximate inner diameter of the inductor to an approximate outer diameter of the inductor. For example, inductor 912 has two turns formed in 10 µm metal and has an inner diameter of 58 µm and an outer diameter of approximately 100 µm. An appropriate aperture diameter is approximately 160 µm.

In general, the Q of the inductor is proportional to aperture size, similar to the relationship between inductor Q and d, discussed above. As the aperture size increases from the outer diameter of the inductor, inductor Q increases. However, an increase in the aperture size decreases shielding of the inductor from external noise sources. Increases in aperture size beyond a certain size produce diminishing returns in improvements to Q and a tradeoff exists between increasing aperture size and decreasing shielding. Apertures having smaller diameters may be desirable in some applications (e.g., applications requiring less of a reduction in the current induced in the electromagnetic shield). Apertures having greater diameters may be desirable in applications where the losses in shielding are acceptable to obtain the corresponding increase in Q. In an exemplary application, the top and bottom plates of the electromagnetic shielding structure may be relatively close to the inductor (e.g., 10 µm) as compared to the physical size of the inductor (e.g., on average approximately 80 µm×80 µm) and an aperture may be included in the electromagnetic shielding structure by omitting one of the top and bottom plates, as illustrated by plate 972 of electrically conductive enclosure 970 in FIG. 9D (i.e., plate 972 is omitted, as indicated by hatching). Referring back to FIG. 9A, although aperture 902 is shown to have eight linear sides in an exemplary process (e.g., a process that allows forming metal having dimensions of 45, 90, and 135 degree from a linear plane) an aperture having any suitable number of sides and a circular aperture (i.e., no sides), are within the scope of the present invention. In addition, an electromagnetic shielding structure may include multiple apertures, the individual apertures located in any suitable plate of an electromagnetic shielding structure.

Although aperture 902 in bottom shield 901 reduces current induced in bottom plate 901 in response to inductor 912, the aperture increases the susceptibility of inductor 912 to external electromagnetic signals. External electromagnetic signals may enter the aperture and ultimately interfere with inductor 912. To reduce the effects of external electromagnetic signals on inductor 912 and an LC oscillator including inductor 912, exemplary electrically conductive links (e.g., electrically conductive links 906 and 910 in FIG. 9B and electrically conductive links 904, 906, 908, and 910 in FIG. 9C, illustrated without inductor 912 for ease of viewing) are included to reduce the effective aperture size. The electrically conductive links form paths extending across the aperture that generate a current flow in response to the external electromagnetic signals. This current flow counteracts the field associated with an external electromagnetic signal entering the aperture.

Exemplary electrically conductive links 904, 906, 908, and 910 are 5 μm wide and are formed in a first traditional metal layer and a second traditional metal layer (e.g., metal-1 and metal-2), the same metal layers as bottom plate 901. Like bottom plate 901, electrically conductive links 904, 906, 908, and 910 may be formed in any other traditional metal layer, an ultra-thick metal layer, two or more sub-links, a redistribution metal layer, other suitable materials, or any combination thereof. The four electrically conductive links extend from respective segments of the aperture perimeter to opposite segments of the aperture perimeter. These links intersect at 45, 90, and 135 degree angles at their respective midpoints. However, any suitable number of links may be used, intersecting at any suitable angle. In some embodiments of the present invention, a center linking structure 966 may be included to provide a 90 degree intersection interface for sub-links of links 904, 906, 908, and 910 to prevent 45 degree intersections of links 904, 906, 908, and 910.

In general, the conductive links reduce the size of the aperture (and reduce the amount of noise that can be coupled in from the outside) while maintaining the improvement in Q resulting from the creation of the aperture. A resulting Q is a function of the width of the links. Wider links allow currents induced in response to external electromagnetic fields to flow easier and produce an improvement in shielding over narrow links. However, wider links have a greater influence on the inductor by making it easier for local eddy currents induced in response to the inductor electromagnetic field to flow. The width of the links may be selected to be wide enough for better shielding, but narrow enough to provide an acceptable Q. An appropriate link width, similar to other dimensions of the invention, is dependent upon operating frequency and size of the inductor.

Referring to FIG. 9C, links 904, 906, 908 and 910 form eight "wedges" in the aperture. These wedges reduce the effective aperture by allowing currents to flow that oppose external electromagnetic signals entering the aperture. These currents are orthogonal to current flow in the inductor, thus, the paths formed in the aperture do not allow a current to flow that opposes the electromagnetic field of the inductor. In one embodiment, the configuration of FIG. 9C reduces by 6 dB, the amount of coupling in the inductor from external sources, as compared to the configuration of FIG. 9A.

Referring to FIG. 10, an exemplary configuration that further reduces an effective aperture includes links 1004, 1006, 1008, and 1010 and at least one additional electrically conductive link (e.g., electrically conductive links 1012 and 1014, illustrated without inductor 912 for ease of viewing) across aperture 1002. Exemplary electrically conductive links 1012 and 1014 are 5 μm wide and are formed in a first traditional metal layer and a second traditional metal layer (e.g., metal-1 and metal-2), the same metal layers as bottom plate 901. Like bottom plate 901, electrically conductive links may be formed in any other traditional metal layer, an ultra-thick metal layer, a redistribution metal layer, other suitable materials, or any combination thereof. Electrically conductive links 1012 and 1014 form additional paths for induced currents to form that counteract external electromagnetic signals. Note that these additional links do not form a path that easily allows an induced current to form that counteracts the electromagnetic flux of inductor 912. In an exemplary process, electrically conductive links (e.g., 1012 and 1014) intersect corresponding ones of electrically conductive links 1004, 1006, 1008, and 1010 at 90 degree angles. However, any suitable number of links may be used, intersecting at any suitable angle to reduce the aperture size.

An exemplary plate of the electromagnetic shield (e.g., bottom plate 1100) approximates a solid metal plate by forming a plurality of continuous conductive patterns that are substantially concentric with respect to an aperture in the plate or, in one embodiment, substantially concentric with respect to the inductor projected into the same plane as the continuous conductive patterns. Referring to FIG. 11A, N substantially octagonal continuous conductive patterns, e.g., continuous conductive patterns 1102, 1104, . . . , 1106, are formed in a metal layer (e.g., metal-1) and are substantially concentric with respect to aperture 1112 in the bottom plate of an electromagnetic shielding structure. Continuous conductive patterns 1102, 1104, and 1106 are 10 μm wide. Continuous conductive patterns 1102 and 1104 are separated by a gap in the metal layer, i.e., gap 1108, that is 2 μm wide, and typically filled with a dielectric material.

Sidewalls of the electromagnetic shield may be formed in additional metal layers (e.g., metal-2-metal-8) of continuous conductive patterns that are substantially concentric with respect to the inductor projected into the same plane as the continuous conductive patterns. In one embodiment, continuous conductive patterns formed in adjacent metal layers are staggered to overlap gaps formed in next-adjacent layers. For example, metal patterns formed in metal-2 overlap the gaps formed in metal-1 (e.g., gap 1104). Continuous conductive patterns formed in alternating layers may be aligned, e.g., continuous conductive patterns formed in metal-1 are aligned with continuous conductive patterns formed in metal-3, and continuous conductive patterns formed in metal-2 are aligned with continuous conductive patterns formed in metal-4. In one embodiment of the present invention, the continuous conductive patterns formed in a metal layer are increasingly spaced out from the inductor with increasing metal layers as the metal layers approach the plane of the inductor. A resulting shielding structure includes a bottom plate having an innermost continuous conductive pattern with a smaller diameter than the upper, innermost continuous conductive patterns, as illustrated in FIG. 11B. An innermost continuous conductive pattern formed in metal layer 1126 has a diameter of P1, which is smaller than diameter P2 of an innermost continuous conductive pattern formed in metal layer 1124.

The continuous conductive patterns may be based at least in part on a substantially octagonal, circular, rectangular, or other suitable shape. In an exemplary embodiment, only a portion of the octagonal patterns above intersection 1110 is formed and the portions of the octagonal patterns are substantially closed by another continuous conductive pattern formed below intersection 1110. The continuous conductive patterns may be formed in typical integrated circuit layers, ultra-thick layers, redistribution layers, or other suitable conductive layers. Dimensions may vary according to a target manufacturing process. The plate may include conductive links extending across aperture 1112 as shown (not to scale).

In other embodiments of the invention, bottom plate 1100 may be formed from a substantially continuous conductive layer.

In some embodiments of the present invention, the capacitor structures of the LC tank circuit and gain stages included in the oscillator circuitry may be fabricated within traditional integrated circuit layers. In some embodiments, the capacitor structures of the LC tank circuit and/or gain stages included in the oscillator circuitry may also be included within the Faraday cage, formed under the inductor in the typical integrated circuit layers. If such circuit structures are formed under the inductor in the typical integrated circuit layers, the lowest metal layer (e.g., a metal layer designated metal-1 in an exemplary process) forms the bottom plate of the Faraday cage. The Faraday cage at least partially shields the circuit elements formed underneath the inductor. The plates of the Faraday cage may allow electrical contact to these circuit elements by including openings for electrical leads. In addition, openings in the Faraday cage may exist to accommodate structures formed in the typical integrated circuit layers, e.g., an amplifier stage that is formed beneath the inductor and coupled to the inductor.

While circuits and physical structures are generally presumed, it is well recognized that in modem semiconductor design and fabrication, physical structures and circuits may be embodied in computer readable descriptive form suitable for use in subsequent design, test or fabrication stages. Accordingly, claims directed to traditional circuits or structures may, consistent with particular language thereof, read upon computer readable encodings and representations of same, whether embodied in media or combined with suitable reader facilities to allow fabrication, test, or design refinement of the corresponding circuits and/or structures. Structures and functionality presented as discrete components in the exemplary configurations may be implemented as a combined structure or component. The invention is contemplated to include circuits, systems of circuits, related methods, and computer-readable medium encodings of such circuits, systems, and methods, all as described herein, and as defined in the appended claims. As used herein, a computer readable medium includes at least disk, tape, or other magnetic, optical, semiconductor (e.g., flash memory cards, ROM), or electronic medium and a network, wireline, wireless or other communications medium.

What is claimed is:

1. An apparatus comprising:
   an inductor;
   an electrically conductive enclosure electromagnetically shielding the inductor, the electrically conductive enclosure having an aperture at least as large as the inductor, the aperture being substantially centered around a projected surface of the inductor;
   a plurality of electrically conductive links, individual ones of the plurality of electrically conductive links extending across the aperture; and
   at least one additional electrically conductive link,
   wherein the plurality of electrically conductive links are electrically coupled to the electrically conductive enclosure and are electrically coupled to each other at a first location within the aperture, and
   wherein individual ones of the plurality of electrically conductive links are coupled to each other at least at a second location within the aperture by the at least one additional electrically conductive link, the at least one additional electrically conductive link being within the aperture.

2. The apparatus, as recited in claim 1, wherein the aperture is substantially parallel to a plane of current flow in the inductor.

3. The apparatus, as recited in claim 1, wherein the plurality of electrically conductive links reduce an effect of electromagnetic signals external to the electrically conductive enclosure on the inductor.

4. The apparatus, as recited in claim 1, wherein the plurality of electrically conductive links and the at least one additional electrically conductive link reduce coupling in the inductor from external sources by approximately 6 dB.

5. The apparatus, as recited in claim 1, wherein each of the plurality of electrically conductive links and the at least one additional electrically conductive link are approximately 5 μm wide.

6. The apparatus, as recited in claim 1, wherein the plurality of electrically conductive links and the at least one additional electrically conductive link are formed in one or more traditional integrated circuit layers.

7. The apparatus, as recited in claim 1, wherein the electrically conductive enclosure includes a top plate, a bottom plate, and sidewalls.

8. The apparatus, as recited in claim 7, wherein the aperture is formed in the bottom plate.

9. The apparatus, as recited in claim 7, wherein the bottom plate is formed in one or more integrated circuit metal layers.

10. The apparatus, as recited in claim 7, wherein the top plate is formed in a metal layer.

11. The apparatus, as recited in claim 7, wherein the top plate is formed in a redistribution layer.

12. The apparatus, as recited in claim 7, wherein the top plate is formed in a package substrate.

13. The apparatus, as recited in claim 1, wherein the inductor is formed at least partially in one or more metal layers of an integrated circuit die thicker than others of the metal layers.

14. The apparatus, as recited in claim 1, wherein the inductor is formed at least partially in one or more redistribution layers formed on an integrated circuit die.

15. The apparatus, as recited in claim 1, wherein the inductor is formed on an integrated circuit die.

16. The apparatus, as recited in claim 15, wherein a conductor forming the inductor is 10 μm wide.

17. The apparatus, as recited in claim 15, wherein the aperture and the inductor are effectively spaced at least 10.25 μm apart.

18. The apparatus, as recited in claim 1, wherein the aperture is formed in an electrically conductive plate of the electrically conductive enclosure.

19. The apparatus, as recited in claim 1, wherein the aperture has an approximate diameter determined by adding an approximate outer diameter of the inductor to an approximate inner diameter of the inductor.

20. The apparatus, as recited in claim 1, wherein the at least one additional electrically conductive link intersects individual ones of the plurality of electrically conductive links at ninety degree angles.

21. The apparatus, as recited in claim 1, wherein the first location is in the center of the aperture and the second location is between the center of the aperture and the perimeter of the aperture.

22. The apparatus, as recited in claim 1, wherein individual ones of the plurality of electrically conductive links are coupled to at least one portion of the electrically conductive enclosure at a third location, the third location being at the perimeter of the aperture.

* * * * *